United States Patent
Hu et al.

(10) Patent No.: US 9,431,600 B2
(45) Date of Patent: Aug. 30, 2016

(54) MAGNETIC DOMAIN WALL SHIFT REGISTER MEMORY DEVICES WITH HIGH MAGNETORESISTANCE RATIO STRUCTURES

(71) Applicants: International Business Machines Corporation, Armonk, NY (US); Industrial Technology Research Institute, Hsinchu (TW)

(72) Inventors: Guohan Hu, Yorktown Heights, NY (US); Cheng-Wei Chien, Hsinchu (TW)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 8 days.

(21) Appl. No.: 14/506,798

(22) Filed: Oct. 6, 2014

(65) Prior Publication Data

US 2016/0099404 A1    Apr. 7, 2016

(51) Int. Cl.
| | |
|---|---|
| *H01L 43/08* | (2006.01) |
| *H01L 43/02* | (2006.01) |
| *H01L 43/10* | (2006.01) |
| *G11C 11/16* | (2006.01) |
| *G11B 5/33* | (2006.01) |

(52) U.S. Cl.
CPC .............. *H01L 43/08* (2013.01); *H01L 43/02* (2013.01); *H01L 43/10* (2013.01); *G11B 5/33* (2013.01); *G11C 11/161* (2013.01)

(58) Field of Classification Search
CPC ....... G11B 5/33; G11C 11/161; H01L 43/02; H01L 43/08; H01L 43/10
USPC ........................................................ 257/211
See application file for complete search history.

(56) References Cited

U.S. PATENT DOCUMENTS

| | | | | |
|---|---|---|---|---|
| 5,898,548 A | * | 4/1999 | Dill ..................... | G11B 5/332 360/319 |
| 5,949,600 A | * | 9/1999 | Akiyama ............... | B82Y 10/00 360/55 |
| 5,994,899 A | * | 11/1999 | Mohri ................... | G01R 33/02 324/117 R |
| 6,048,632 A | * | 4/2000 | Solin ..................... | B82Y 10/00 324/252 |

(Continued)

OTHER PUBLICATIONS

B. Min et al., "MgO-based magnetic tunnel junctions for spin-transfer-torque random access memory," 10th IEEE Conference on Nanotechnology (IEEE-NANO), Aug. 17-20, 2010, pp. 144-147.

(Continued)

*Primary Examiner* — Nathan Ha
(74) *Attorney, Agent, or Firm* — Cantor Colburn LLP; Vazken Alexanian (57) ABSTRACT

A device includes a seed layer, a magnetic track layer disposed on the seed layer, an alloy layer disposed on the magnetic track layer, a tunnel barrier layer disposed on the alloy layer, a pinning layer disposed on the tunnel barrier layer, a synthetic antiferromagnetic layer spacer disposed on the pinning layer, a pinned layer disposed on the synthetic antiferromagnetic spacer layer and an antiferromagnetic layer disposed on the pinned layer, and another device includes a seed layer, an antiferromagnetic layer disposed on the seed layer, a pinned layer disposed on the antiferromagnetic layer, a synthetic antiferromagnetic layer spacer disposed on the pinned layer, a pinning layer disposed on the synthetic antiferromagnetic layer spacer, a tunnel barrier layer disposed on the pinning layer, an alloy layer disposed on the tunnel barrier layer and a magnetic track layer disposed on alloy layer.

19 Claims, 12 Drawing Sheets

(56) References Cited

U.S. PATENT DOCUMENTS

| | | |
|---|---|---|
| 6,834,005 B1 | 12/2004 | Parkin |
| 6,920,062 B2 | 7/2005 | Parkin |
| 7,236,386 B2 | 6/2007 | Parkin |
| 7,502,253 B2 | 3/2009 | Rizzo |
| 7,876,595 B2 | 1/2011 | Xi et al. |
| 8,004,881 B2 | 8/2011 | Zhu et al. |
| 2006/0198062 A1* | 9/2006 | Ide .................. B82Y 25/00 360/324.12 |
| 2007/0278603 A1 | 12/2007 | Ochiai et al. |
| 2009/0046397 A1 | 2/2009 | Sun et al. |
| 2010/0061135 A1 | 3/2010 | Nagasaka et al. |
| 2011/0188298 A1 | 8/2011 | Suzuki et al. |

OTHER PUBLICATIONS

S. Parkin et al., "Magnetic Domain-Wall Racetrack Memory," Science, vol. 320, No. 5873, Apr. 11, 2008, pp. 190-194.

\* cited by examiner

MAGNETIC DOMAIN WALL SHIFT REGISTER MEMORY DEVICES WITH HIGH MAGNETORESISTANCE RATIO STRUCTURES

BACKGROUND

The present invention relates to magnetic domain wall shift register memory devices, and more specifically, to magnetic domain wall shift register memory devices with high magnetoresistance ratio structures and methods of fabricating the same.

Magnetic domain wall shift register memory devices require sensing elements to read out the signal from the magnetic track. Currently, there are two major types of sensing elements that are implemented. One sensing type is a conductive wire that directly contacts with the track and reads the signal by an anomalous Hall Effect. Another sensing type is a magnetic tunnel junction (MTJ) disposed on top or at the bottom of the track, and reads the tunnel magnetoresistance (TMR). The signal from the anomalous Hall Effect is much smaller than that from MTJ. As such, the MTJ is a promising sensing element for reading out the signal from the magnetic track. As the MTJ is applied as a reader, the TMR ratio is a key factor in reading the signal. The TMR ratio of the MTJ is usually low when permalloy is used as the magnetic track. One can increase the TMR by thickening an MgO (magnesium oxide) layer, but the magnetoresistance dramatically increases. As such, a higher voltage for the same reading current is required, and generally is unsuitable for real time readings.

SUMMARY

Exemplary embodiments include a magnetic domain wall shift register memory device, including a seed layer, a magnetic track layer disposed on the seed layer, an alloy layer disposed on the magnetic track layer, a tunnel barrier layer disposed on the alloy layer, a pinning layer disposed on the tunnel barrier layer, a synthetic antiferromagnetic layer spacer disposed on the pinning layer, a pinned layer disposed on the synthetic antiferromagnetic spacer layer and an antiferromagnetic layer disposed on the pinned layer.

Further exemplary embodiments include a magnetic domain wall shift register memory device, including a seed layer, an antiferromagnetic layer disposed on the seed layer, a pinned layer disposed on the antiferromagnetic layer, a synthetic antiferromagnetic layer spacer disposed on the pinned layer, a pinning layer disposed on the synthetic antiferromagnetic layer spacer, a tunnel barrier layer disposed on the pinning layer, an alloy layer disposed on the tunnel barrier layer and a magnetic track layer disposed on alloy layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments include a magnetic domain wall shift register memory device with high magnetoresistive ratio structures and methods for making thereof. In exemplary embodiments, an effective way to increase the TMR ratio is to add a cobalt-iron-boron (CoFeB) layer between a magnetic track and a magnesium oxide (MgO) barrier of the magnetic domain wall shift register memory device. As such, the systems and methods described herein, add a CoFeB layer adjacent to the magnetic track to increase the tunneling probability through the MgO tunnel barrier and to increase. In exemplary embodiments, the TMR ratio can be further increased by inserting a spacer layer between magnetic track and the CoFeB layer. The systems and methods described herein can increase the TMR ratio a lot with almost no change on magnetoresistance.

Figure 1:
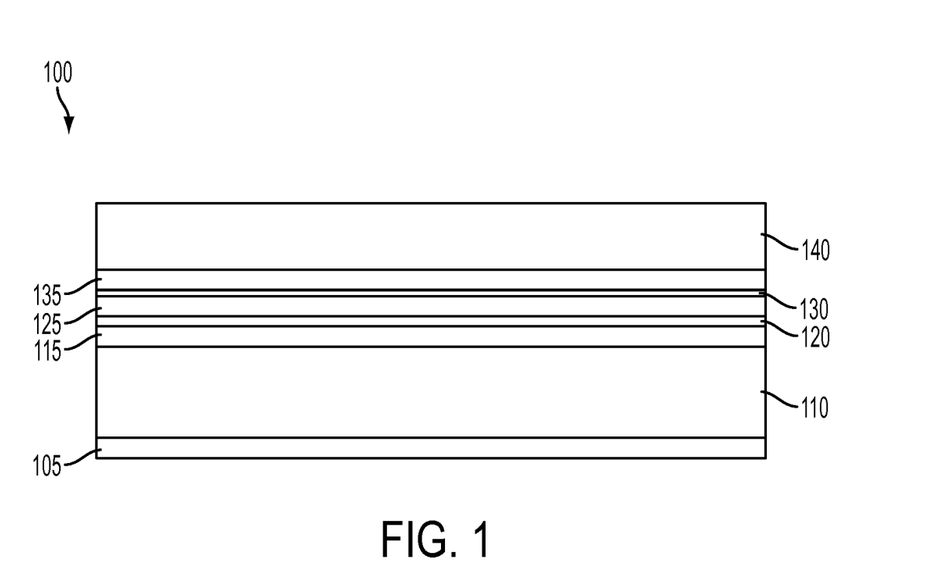
FIG. 1 illustrates a starting structure for an exemplary magnetic domain wall shift register memory device.
Figure 2:
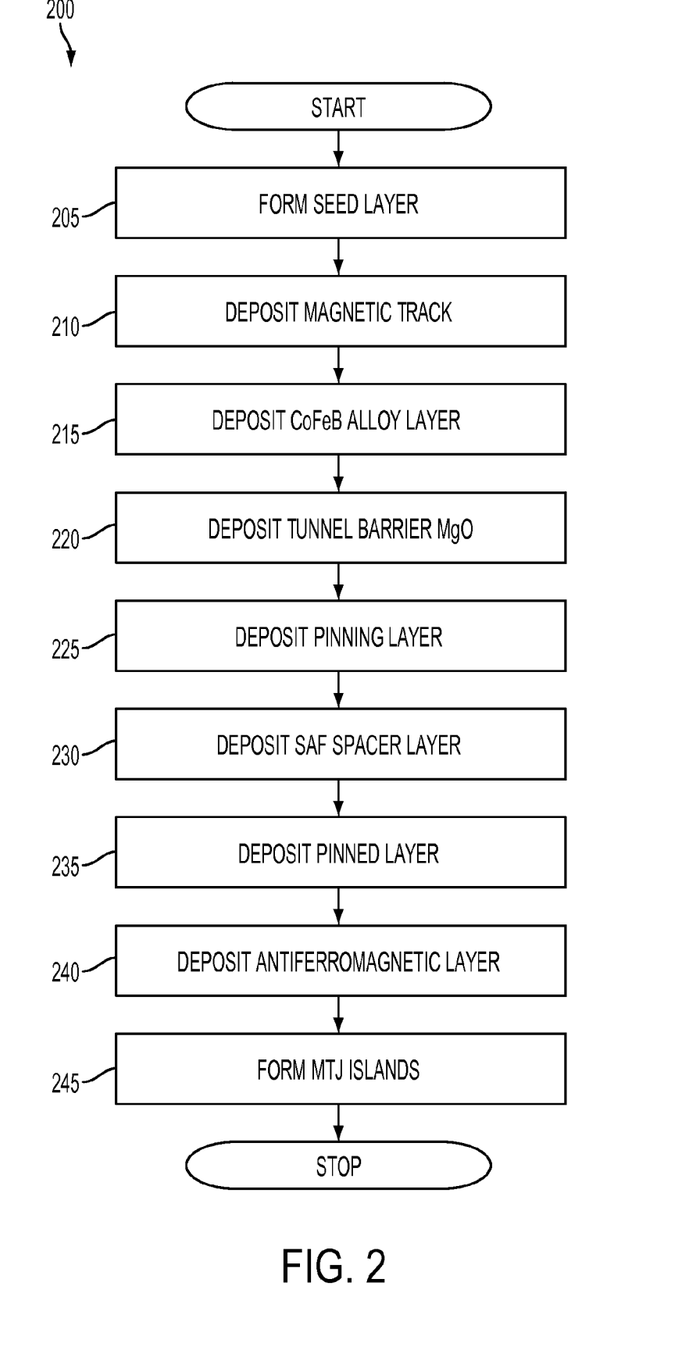
FIG. 2 illustrates a flow chart for a method of fabricating an exemplary a magnetic domain wall shift register memory device in accordance with exemplary embodiments.
Figure 3:
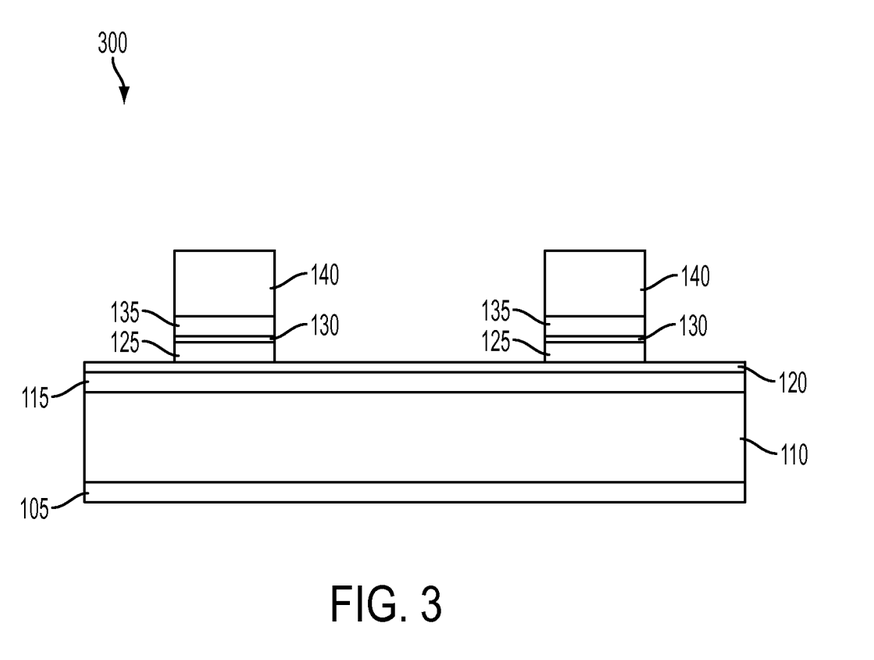
FIG. 3 illustrates a final structure for an exemplary magnetic domain wall shift register memory device.

FIG. 1 illustrates a starting structure 100 for an exemplary magnetic domain wall shift register memory device. FIG. 2 illustrates a flow chart for a method 200 of fabricating an exemplary a magnetic domain wall shift register memory device in accordance with exemplary embodiments. At block 205, a seed layer 105 is formed by depositing a suitable metallic substance such as tantalum nitride (TaN), titanium nitride (TiN) or Ta on a template substance such as silicon nitride (SiN) or silicon oxide ($SiO_x$). At block 210, a magnetic track 110 is deposited on the seed layer 105. The magnetic track 110 can be any suitable material such as a permalloy, Fe, Co, nickel (Ni), CoFe or any kind of magnetic alloy. At block 215, a CoFeB alloy layer 115 is deposited on top of the magnetic track 110. In exemplary embodiments, the CoFeB layer can be any CoFeB structure, including CoFeB|CoFe and CoFeB|Fe bilayers. At block 220, a tunnel barrier MgO 120 is deposited on the CoFeB alloy layer 115. At block 225, a pinning layer 125 is deposited on the tunnel barrier MgO 120. At block 230, a synthetic antiferromagnetic (SAF) spacer layer 130 is deposited on the pinning layer 125. At block 235, a pinned layer 135 is deposited on the SAF spacer layer 130. The pinning layer 125, the SAF spacer layer 120 and the pinning layer 125 together form SAF layers. In exemplary embodiments, the pinning layer 125 can be a pure CoFeB layer with Fe content ranging from 10% to 90%, a pure CoFe layer or a bilayer structure with CoFeB|Fe, CoFe|CoFeB, or two CoFeB layers with different compositions. In exemplary embodiments, the SAF spacer layer 130 can be ruthenium (Ru). In exemplary embodiments, the pinned layer 135 can be CoFe or CoFeB. At block 240, an antiferromagnetic layer 140 is deposited on the SAF layers (i.e., on the pinned layer 135. In exemplary embodiments, the antiferromagnetic layer 140 can be platinum manganese (PtMn) or iridium manganese (IrMn). At block 245, MTJ islands are formed by etching portions of the SAF layers (i.e., the pinning layer 125, the SAF spacer layer 130, and the pinned layer 135) and the antiferromagnetic layer 140. FIG. 3 illustrates a final structure 300 for an exemplary magnetic domain wall shift register memory device after etching at block 245.

Figure 4:
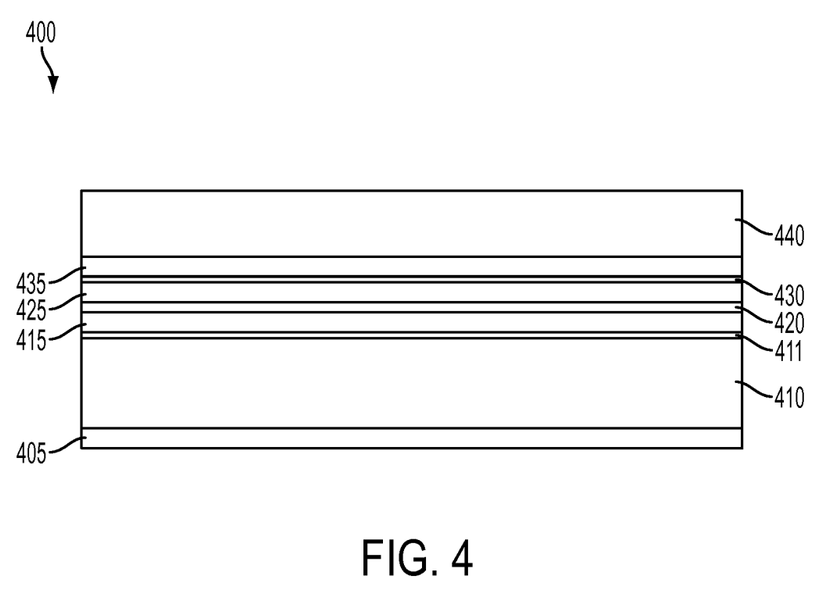
FIG. 4 illustrates a starting structure for an exemplary magnetic domain wall shift register memory device.
Figure 5:
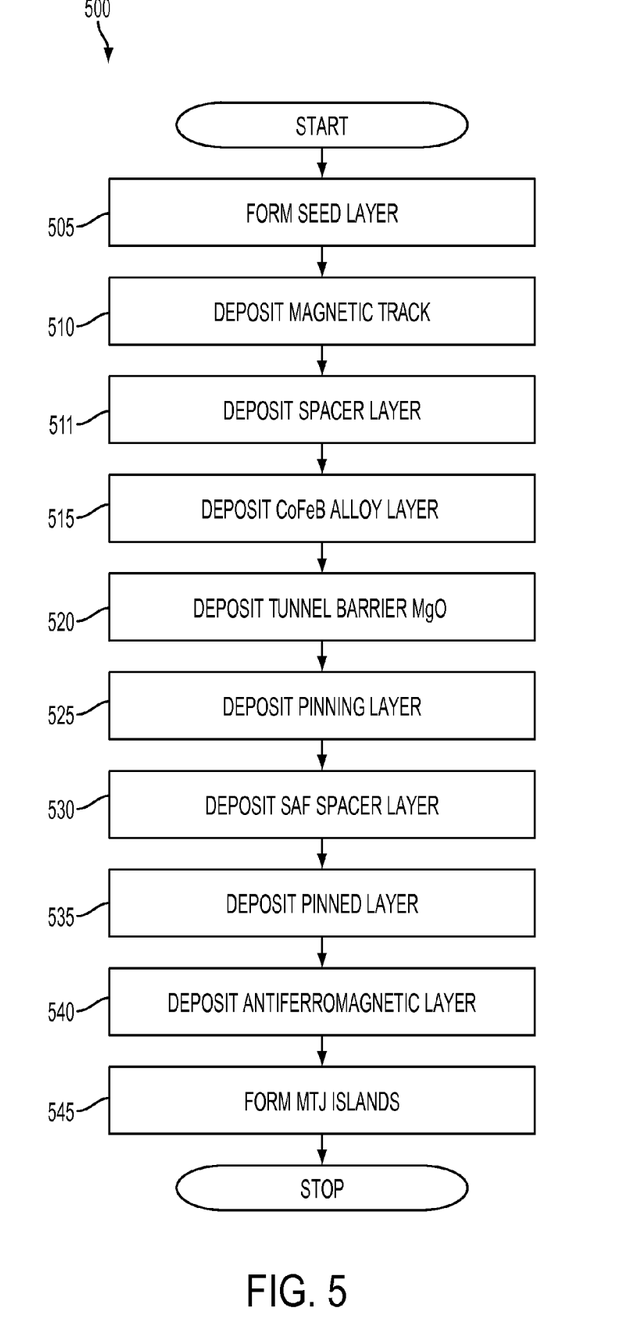
FIG. 5 illustrates a flow chart for a method of fabricating an exemplary a magnetic domain wall shift register memory device in accordance with exemplary embodiments.
Figure 6:
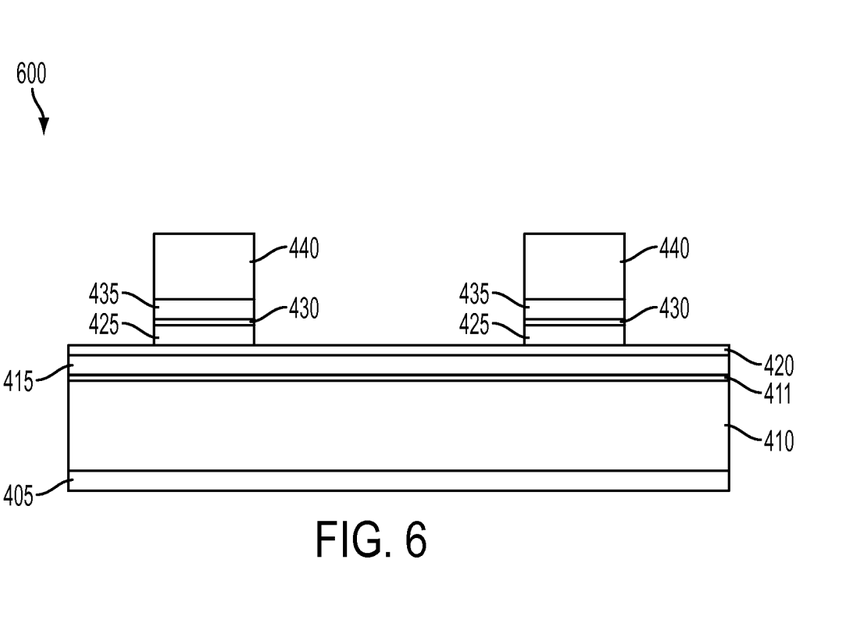
FIG. 6 illustrates a final structure for an exemplary magnetic domain wall shift register memory device.

FIG. 4 illustrates a starting structure 400 for an exemplary magnetic domain wall shift register memory device. FIG. 5 illustrates a flow chart for a method 500 of fabricating an exemplary a magnetic domain wall shift register memory device in accordance with exemplary embodiments. At block 505, a seed layer 405 is formed by depositing a suitable metallic substance such as TaN, TiN or Ta on a template substance such as SiN or $SiO_x$. At block 510, a magnetic track 410 is deposited on the seed layer 405. The magnetic track 110 can be any suitable material such as a permalloy, Fe, Co, Ni, CoFe or any kind of magnetic alloy. At block 511, a spacer layer 411 is deposited on top of magnetic track 410 to separate the magnetic track 410 from the following CoFeB alloy layer to be deposited. In exemplary embodiments, the spacer layer 411 can be Ta, TaN, vanadium (V), chromium (Cr), molybdenum (Mo), tungsten (W) or Fe. At block 515, a CoFeB alloy layer 415 is deposited on top of the spacer layer 411. At block 520, a tunnel barrier MgO 420 is deposited on the CoFeB alloy layer 415. At block 525, a pinning layer 425 is deposited on the tunnel barrier MgO 420. At block 530, an SAF spacer layer 430 is deposited on the pinning layer 425. At block 535, a pinned layer 435 is deposited on the SAF spacer layer 430. The pinning layer 425, the SAF spacer layer 420 and the pinning layer 425 together form SAF layers. In exemplary embodiments, the pinning layer 425 can be a pure CoFeB layer with Fe content ranging from 10% to 90%, a pure CoFe layer or a bilayer structure with CoFeB|Fe, CoFe|CoFeB, or two CoFeB layers with different compositions. In exemplary embodiments, the SAF spacer layer 430 can be Ru. In exemplary embodiments, the pinned layer 435 can be CoFe or CoFeB. At block 540, an antiferromagnetic layer 440 is deposited on the SAF layers (i.e., on the pinned layer 435. In exemplary embodiments, the antiferromagnetic layer 440 can be PtMn or IrMn. At block 545, MTJ islands are formed by etching portions of the SAF layers (i.e., the pinning layer 425, the SAF spacer layer 430, and the pinned layer 435) and the antiferromagnetic layer 440. FIG. 6 illustrates a final structure 600 for an exemplary magnetic domain wall shift register memory device after etching at block 545.

Figure 7:
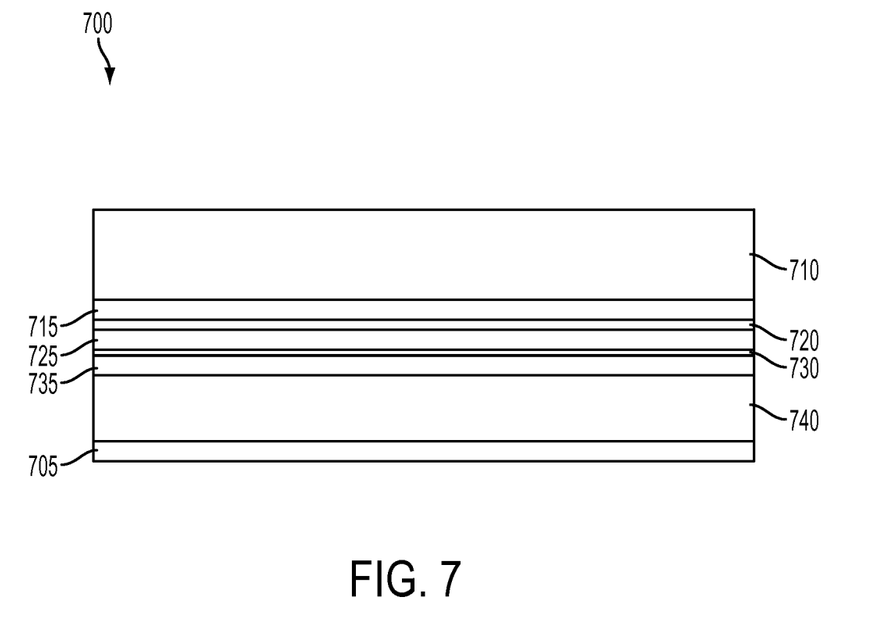
FIG. 7 illustrates a starting structure for an exemplary magnetic domain wall shift register memory device.
Figure 8:
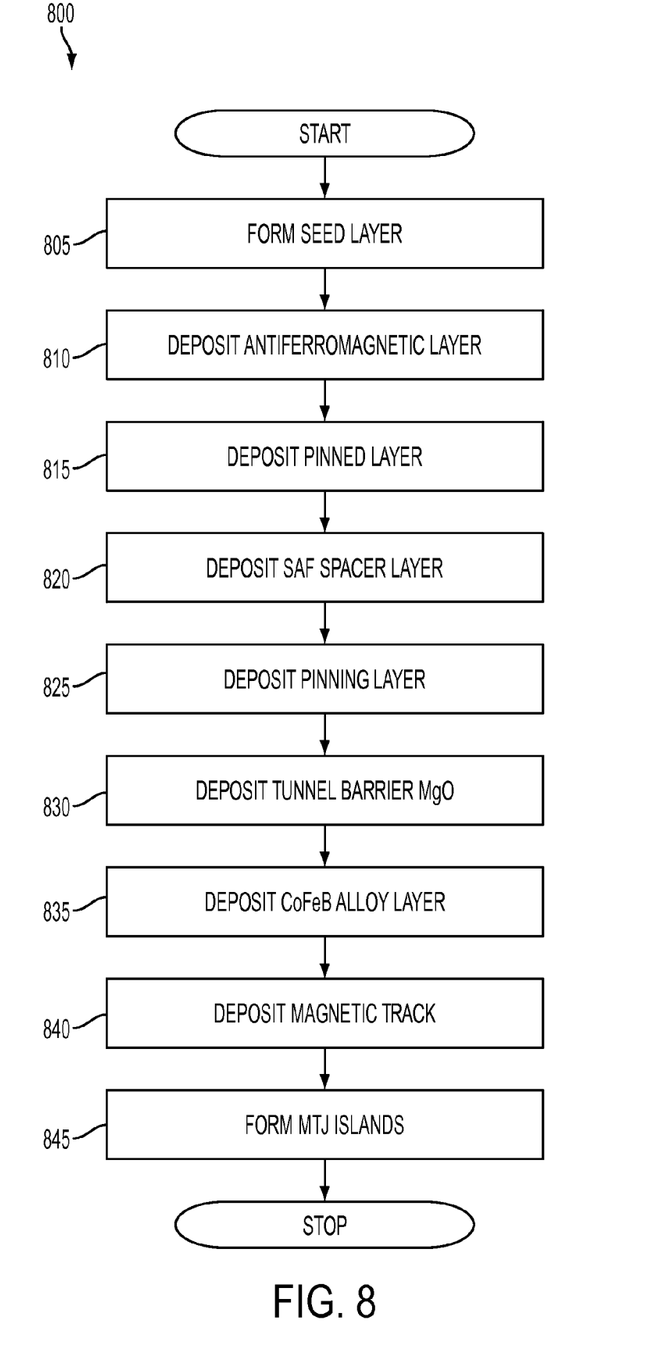
FIG. 8 illustrates a flow chart for a method of fabricating an exemplary a magnetic domain wall shift register memory device in accordance with exemplary embodiments.
Figure 9:
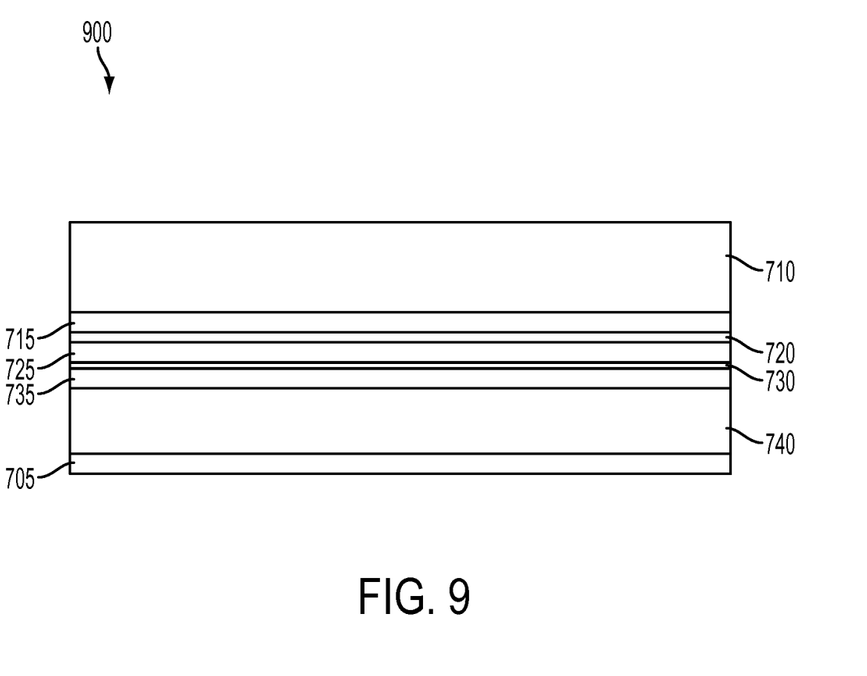
FIG. 9 illustrates a final structure for an exemplary magnetic domain wall shift register memory device.

FIG. 7 illustrates a starting structure 700 for an exemplary magnetic domain wall shift register memory device. FIG. 8 illustrates a flow chart for a method 800 of fabricating an exemplary magnetic domain wall shift register memory device in accordance with exemplary embodiments. At block 805, a seed layer 705 is formed by depositing a suitable metallic substance such as TaN, TiN or Ta on a template substance such as SiN or SiOx. At block 810, an antiferromagnetic layer 740 is deposited on the seed layer 705. In exemplary embodiments, the antiferromagnetic layer 140 can be PtMn or IrMn. At block 815, a pinned layer 735 is deposited on the antiferromagnetic layer 740. At block 820, an SAF spacer layer 730 is deposited on the pinned layer 735. At block 825, a pinning layer 725 is deposited on the SAF spacer layer 730. The pinning layer 725, the SAF spacer layer 730 and the pinned layer 735 together form SAF layers. In exemplary embodiments, the pinning layer 725 can be a pure CoFeB layer with Fe content ranging from 10% to 90%, a pure CoFe layer or a bilayer structure with CoFeB|Fe, CoFe|CoFeB, or two CoFeB layers with different compositions. In exemplary embodiments, the SAF spacer layer 730 can be Ru. In exemplary embodiments, the pinned layer 735 can be CoFe or CoFeB. At block 830, a tunnel barrier MgO 720 is deposited on the pinning layer 725. At block 835, a CoFeB alloy layer 715 is deposited on top of tunnel barrier MgO 720. At block 840, a magnetic track 710 is deposited on the CoFeB alloy layer 715. The magnetic track 710 can be any suitable material such as a permalloy, Fe, Co, Ni, CoFe or any kind of magnetic alloy. At block 845, MTJ islands are formed by etching portions of the seed layer 705, the SAF layers (i.e., the pinning layer 725, the SAF spacer layer 730, and the pinned layer 735), and the antiferromagnetic layer 140. FIG. 9 illustrates a final structure 900 for an exemplary magnetic domain wall shift register memory device after etching at block 845.

Figure 10:
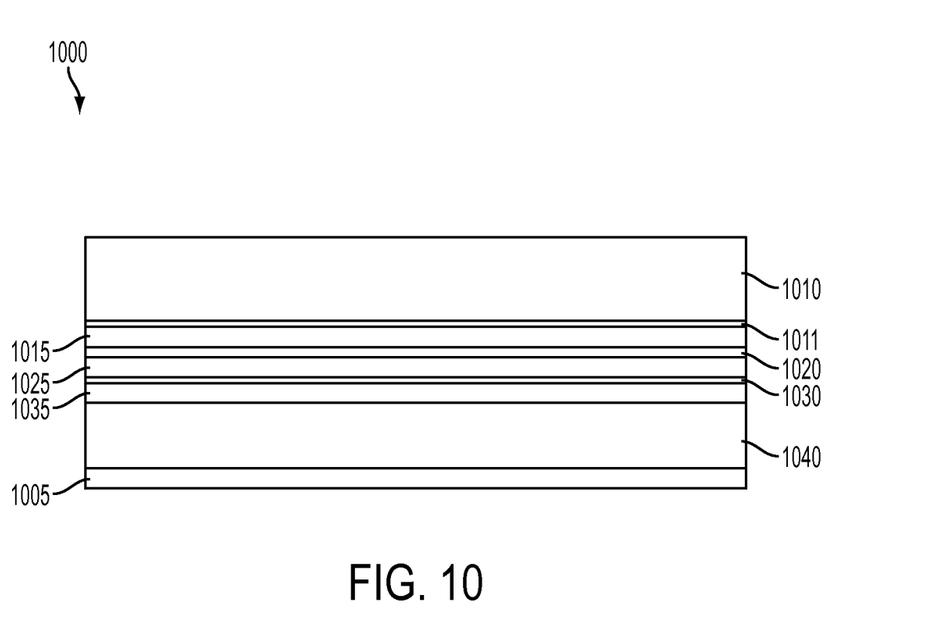
FIG. 10 illustrates a starting structure for an exemplary magnetic domain wall shift register memory device.
Figure 11:
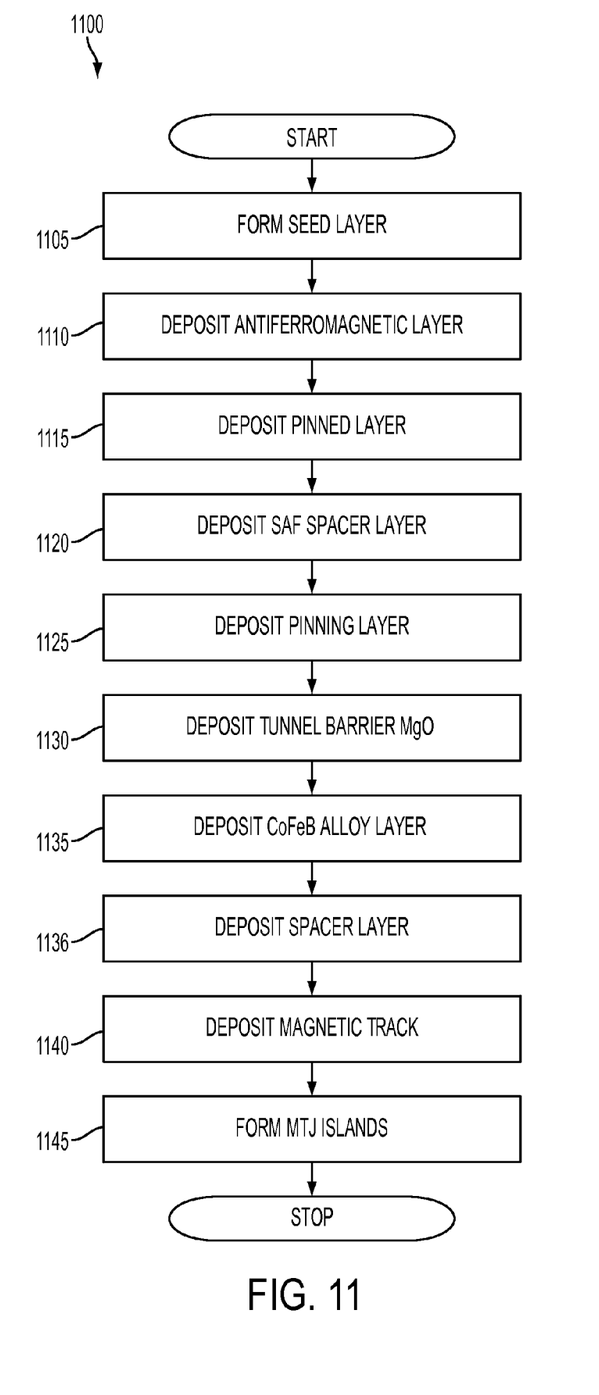
FIG. 11 illustrates a flow chart for a method of fabricating an exemplary a magnetic domain wall shift register memory device in accordance with exemplary embodiments.
Figure 12:
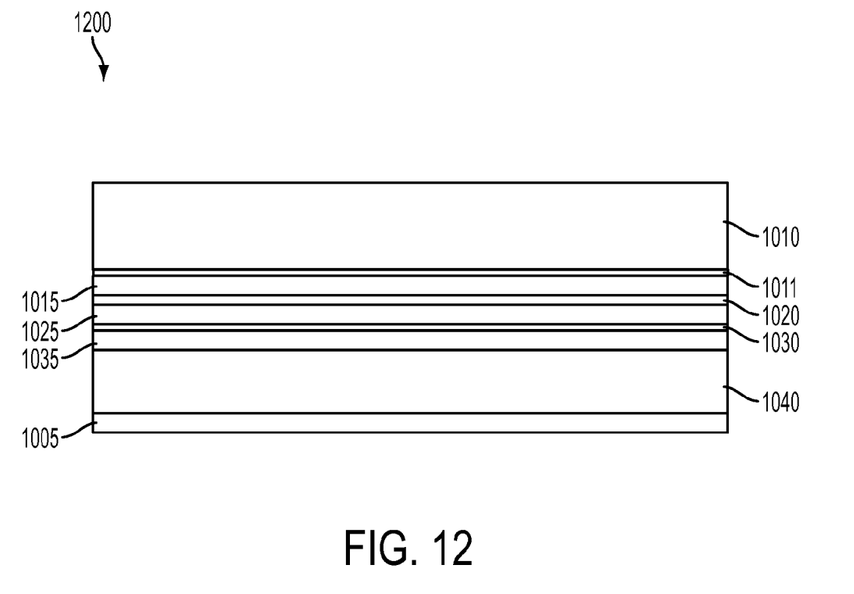
FIG. 12 illustrates a final structure for an exemplary magnetic domain wall shift register memory device.

FIG. 10 illustrates a starting structure 1000 for an exemplary magnetic domain wall shift register memory device. FIG. 11 illustrates a flow chart for a method 1100 of fabricating an exemplary a magnetic domain wall shift register memory device in accordance with exemplary embodiments. At block 1105, a seed layer 1005 is formed by depositing a suitable metallic substance such as TaN, TiN or Ta on a template substance such as SiN or $SiO_x$. At block 1110, an antiferromagnetic layer 1040 is deposited on the seed layer 1005. In exemplary embodiments, the antiferromagnetic layer 1040 can be PtMn or IrMn. At block 1115, a pinned layer 1035 is deposited on the antiferromagnetic layer 1040. At block 1120, an SAF spacer layer 1030 is deposited on the pinned layer 1035. At block 1125, a pinning layer 1025 is deposited on the SAF spacer layer 1030. The pinning layer 1025, the SAF spacer layer 1030 and the pinned layer 1035 together form SAF layers. In exemplary embodiments, the pinning layer 1025 can be a pure CoFeB layer with Fe content ranging from 10% to 90%, a pure CoFe layer or a bilayer structure with CoFeB|Fe, CoFe|CoFeB, or two CoFeB layers with different compositions. In exemplary embodiments, the SAF spacer layer 1030 can be Ru. In exemplary embodiments, the pinned layer 1035 can be CoFe or CoFeB. At block 1130, a tunnel barrier MgO 1020 is deposited on the pinning layer 1025. At block 1135, a CoFeB alloy layer 1015 is deposited on top of tunnel barrier MgO 1020. At block 1136, a spacer layer 1011 is deposited on top of CoFeB alloy layer 1015 to separate the following magnetic track from the CoFeB alloy layer 715 to be deposited. In exemplary embodiments, the spacer layer 1011 can be Ta, TaN, V, Cr, Mo, W or Fe. At block 1140, a magnetic track 1010 is deposited on the CoFeB alloy layer 1015. The magnetic track 1010 can be any suitable material such as a permalloy, Fe, Co, Ni, CoFe or any kind of magnetic alloy. At block 1145, MTJ islands are formed by etching portions of the seed layer 1005, the SAF layers (i.e., the pinning layer 1025, the SAF spacer layer 1030, and the pinned layer 1035), and the antiferromagnetic layer 140. FIG. 12 illustrates a final structure 1200 for an exemplary magnetic domain wall shift register memory device after etching at block 1145.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A magnetic domain wall shift register memory device, comprising:
    a seed layer;
    a magnetic track layer disposed on the seed layer;
    an alloy layer disposed on the magnetic track layer;
    a tunnel barrier layer disposed on the alloy layer;
    a pinning layer disposed on the tunnel barrier layer;
    a synthetic antiferromagnetic (SAF) layer spacer disposed on the pinning layer;
    a pinned layer disposed on the SAF spacer layer; and
    an antiferromagnetic layer disposed on the pinned layer.

2. The device as claimed in claim 1 wherein the seed layer comprises:
    a template layer; and
    a metallic layer disposed on the template layer.

3. The device as claimed in claim 1 wherein the magnetic track layer is a magnetic alloy.

4. The device as claimed in claim 1 wherein the alloy layer is a CoFeB alloy and the tunnel barrier layer is MgO.

5. The device as claimed in claim 1 wherein the pinning layer is CoFeB layer, including a Fe content of about 10% to 90%.

6. The device as claimed in claim 1 wherein the pinned layer is selected from the group consisting of: CoFe and CoFeB.

7. The device as claimed in claim 1 further comprising a spacer layer disposed between the magnetic track layer and the alloy layer.

8. The device as claimed in claim 1 wherein the pinning layer, the SAF layer spacer, the pinned layer, and the antiferromagnetic layer are included in magnetic tunnel junction disposed on the tunnel barrier layer.

9. The device as claimed in claim 1 wherein the seed layer comprises:
    a template layer; and
    a metallic layer disposed on the template layer.

10. A magnetic domain wall shift register memory device, comprising:
    a seed layer;
    an antiferromagnetic layer disposed on the seed layer;
    a pinned layer disposed on the antiferromagnetic layer;
    a synthetic antiferromagnetic (SAF) layer spacer disposed on the pinned layer;
    a pinning layer disposed on the SAF layer spacer;
    a tunnel barrier layer disposed on the pinning layer;
    an alloy layer disposed on the tunnel barrier layer; and
    a magnetic track layer disposed on alloy layer.

11. The device as claimed in claim 10 wherein the antiferromagnetic layer is selected from the group consisting of PtMn and IrMn.

12. The device as claimed in claim 10 wherein the pinned layer is selected from the group consisting of: CoFe and CoFeB.

13. The device as claimed in claim 10 wherein the SAF spacer layer is Ru.

14. The device as claimed in claim 10 wherein the pinning layer is CoFeB layer, including a Fe content of about 10% to 90%.

15. The device as claimed in claim 10 wherein the alloy layer is a CoFeB alloy and the tunnel barrier layer is MgO.

16. The device as claimed in claim 10 wherein the magnetic track layer is a magnetic alloy.

17. The device as claimed in claim 10 further comprising a spacer layer disposed between the magnetic track layer and the alloy layer.

18. The device as claimed in claim 10 wherein the seed layer, the antiferromagnetic layer, pinned layer, the SAF layer spacer, and the pinning layer are included in magnetic tunnel junction disposed on the tunnel barrier layer.

19. A magnetic domain wall shift register memory device, comprising:
    a seed layer;
    a magnetic track layer disposed on the seed layer;
    an alloy layer disposed on the magnetic track layer;
    a tunnel barrier layer disposed on the alloy layer;
    a pinning layer disposed on the tunnel barrier layer;
    a synthetic antiferromagnetic (SAF) layer spacer disposed on the pinning layer and comprising Ru;
    a pinned layer disposed on the SAF spacer layer; and
    an antiferromagnetic layer disposed on the pinned layer and being selected from the group consisting of PtMn and IrMn.

* * * * *